United States Patent [19]

Fox

[11] Patent Number: 4,618,920
[45] Date of Patent: Oct. 21, 1986

[54] FREQUENCY CONTROL CIRCUIT

[75] Inventor: David A. Fox, Shawnee Township, Perry County, Ohio

[73] Assignee: Westinghouse Electric Corp., Pittsburgh, Pa.

[21] Appl. No.: 613,676

[22] Filed: May 24, 1984

[51] Int. Cl.[4] .................... H02M 5/45; H03K 3/72
[52] U.S. Cl. ........................ 363/37; 307/526; 328/134; 328/141; 363/98; 363/132
[58] Field of Search ............ 363/98, 34, 37, 132, 363/65; 307/525, 526, 527, 528; 328/133, 134, 140, 141

[56] References Cited

U.S. PATENT DOCUMENTS

| | | |
|---|---|---|
| 3,254,314 | 5/1966 | Healey . |
| 3,715,649 | 2/1973 | Ravas . |
| 3,866,129 | 2/1975 | Cornelisson ............ 328/133 |
| 3,908,132 | 9/1975 | Krampe et al. .......... 363/65 |
| 4,540,945 | 9/1985 | Kuroki .................. 328/134 |

FOREIGN PATENT DOCUMENTS 885139 12/1961 United Kingdom .
1353791 5/1974 United Kingdom .

Primary Examiner—Clifford C. Shaw
Attorney, Agent, or Firm—R. P. Lenart

[57] ABSTRACT

A frequency control circuit for controlling the output frequency of an inverter power pole switching arrangement produces a modified clock signal by inhibiting clock pulses of a stable clock signal in response to output pulses of a voltage controlled oscillator. The average frequency of the modified clock signal is then equal to the difference between the original clock signal and the output frequency of the voltage controlled oscillator. A control voltage which represents the difference between a normal inverter output frequency and the frequency of an external power source is used to control the output frequency of the voltage controlled oscillator.

4 Claims, 5 Drawing Figures

FREQUENCY CONTROL CIRCUIT

BACKGROUND OF THE INVENTION

This invention relates to frequency control circuits and more particularly to such circuits which are used to control the output frequency of an electronic inverter.

Inverter circuits such as those found in DC-link variable speed constant frequency (VSCF) power systems include a plurality of power pole switching elements which operate with a fixed switching pattern generated by a microprocessor or other digital circuit. Both systems utilize a crystal oscillator as the frequency reference to control the output frequency of the inverter to within, for example, less than 0.05% of 400 Hz. In certain applications such as aircraft power systems, it is desirable to operate the inverter in parallel with another source such as a ground power cart. To permit the momentary paralleling of a VSCF system with an external power source for non-interrupted power transfer, it is necessary to force the output of the VSCF inverter into synchronism with the external power source. A typical ground power source may be subject to large frequency swings such as ±5% of 400 Hz. To track the power swings, the VSCF inverter requires a variable frequency reference signal. Although voltage controlled crystal oscillators are available, they generally operate over a small range of, for example, ±0.1%. Non-crystal voltage controlled oscillators can be designed to have any frequency range. However, in the 3 to 6 MHz range, voltage controlled oscillators use varactor tuning diodes in resonant circuits to vary the frequency. These circuits use very small capacitors and inductors and, therefore, are sensitive to layout and construction restraints. They are also sensitive to varnish and moisture and must be temperature compensated. Therefore, voltage controlled oscillators for use in aircraft power supply applications are relatively complex and occupy a relatively large volume.

SUMMARY OF THE INVENTION

The present invention seeks to provide a frequency control circuit which may be used to control the output frequency of a DC-link VSCF inverter with a stability which is nearly as good as a crystal oscillator. This is accomplished through the combination of a crystal controlled clock signal with a low frequency signal produced by a voltage controlled oscillator. A frequency control circuit constructed in accordance with the present invention comprises: an input terminal for receiving a clock signal comprising a plurality of voltage pulses which occur at a fixed frequency; a voltage controlled oscillator for producing an output signal comprising a plurality of voltage pulses which occur at a variable frequency, dependent upon an applied control voltage; and means for gating the clock signal to produce a modified clock signal by passing the clock signal to an output terminal such that each clock signal voltage pulse which immediately succeeds a voltage pulse from the voltage controlled oscillator is inhibited. When used to control an inverter output, the control voltage applied to the voltage controlled oscillator represents the difference between the normal inverter output frequency and the frequency of an external power source. This system provides frequency adjustment without the need for a variable main frequency oscillator.

DESCRIPTION OF THE PREFERRED EMBODIMENTS

Figure 1:
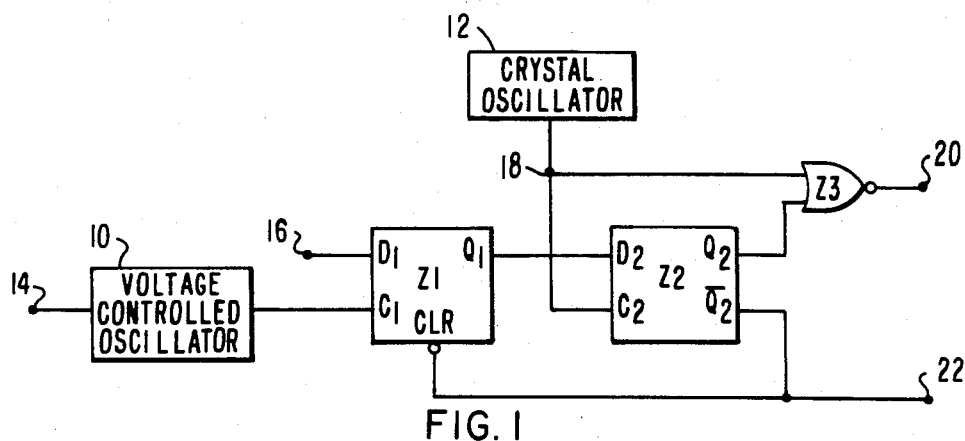
FIG. 1 is a schematic diagram, of a frequency control circuit constructed in accordance with one embodiment of the present invention.

Referring now to the drawings, FIG. 1 is a schematic diagram of a frequency control circuit constructed in accordance with one embodiment of the present invention. This circuit includes a voltage controlled oscillator 10 having a relatively low output frequency of, for example, 0 to 10% of the output frequency of crystal oscillator 12. Voltage controlled oscillator 10 receives a control voltage, which may be a DC voltage, on an input terminal 14 and generates an output signal comprising a plurality of voltage pulses which occur at a variable frequency, dependent upon the applied control voltage. A first bistable circuit such as type D flip flop Z1 receives the VCO output signal on terminal $C_1$. A logic high signal is maintained on terminal 16 such that data input $D_1$ continuously sees a logic high signal. Therefore, the VCO output pulses set flip flop Z1 such that its output $Q_1$ remains high and causes a second bistable circuit such as type D flip flop Z2 to set its output $Q_2$ high when the next clock pulse arrives on input terminal $C_2$. Crystal oscillator 12 produces an output signal which comprises a plurality of voltage pulses occurring at a fixed frequency on terminal 18. When output $Q_2$ goes high, output $\overline{Q_2}$ goes low, resetting flip flop Z1 output $Q_1$ to zero. The next clock pulse then toggles flip flop Z2 output $Q_2$ back to zero. Therefore, output $Q_2$ goes high for exactly one cycle of the clock frequency every time a VCO output pulse occurs.

The logic of FIG. 1 produces two outputs on terminals 20 and 22, respectively. If the inverter being controlled includes a microprocessor, terminal 22 may be considered to be a $\overline{\text{Wait}}$ output which is connected to the ready input of the microprocessor and NOR gate Z3 is not used. The microprocessor will then enter a wait state while its ready input is low, thus missing one clock cycle. If the inverter includes a digital pattern generator circuit which does not include a microprocessor, NOR gate Z3 is used to combine output $Q_2$ and clock signals from terminal 18 to produce a modified clock signal by gating the voltage pulses of the crystal oscillator clock signal to output terminal 20 such that each clock signal voltage pulse which immediately succeeds a voltage controlled oscillator output signal voltage pulse is inhibited. Therefore, the modified clock signals appearing on terminal 20 skip the next full clock pulse after receiving a voltage controlled oscillator output pulse. No half pulses or glitches are possible with this circuit since only full pulses are allowed to pass through NOR gate Z3. If the crystal oscillator clock frequency is $f_c$, and the voltage controlled oscillator output frequency is $f_v$, then the modified clock frequency $f_0$ is equal to $f_c - f_v$.

Figure 2:
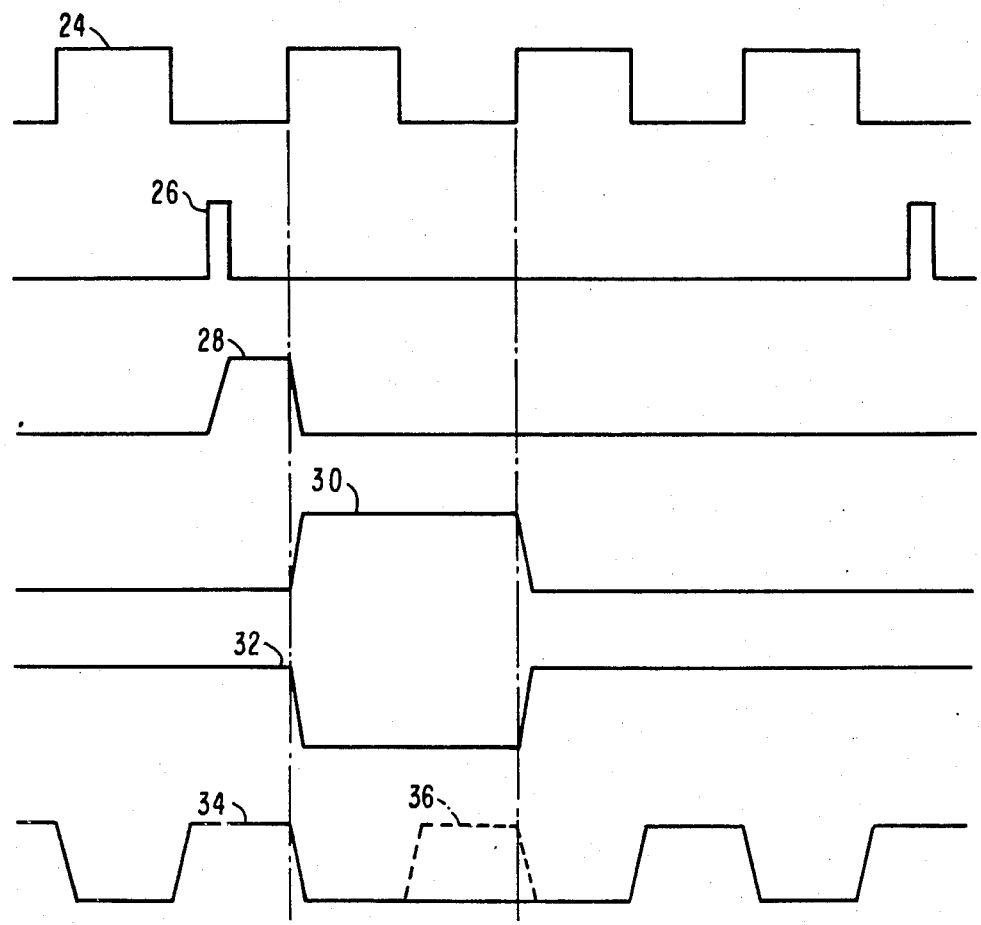
FIG. 2 is a series of waveforms illustrating the operation of the circuit of FIG. 1.

FIG. 2 is a series of waveforms which illustrate the operation of the circuit of FIG. 1. Waveform 24 of FIG.

2 represents the output of crystal oscillator 12 and comprises a plurality of voltage pulses which occur at a fixed frequency. Waveform 26 illustrates the output of voltage controlled oscillator 10 and comprises a plurality of voltage pulses which occur at a variable frequency, dependent upon the control voltage applied to terminal 14. Waveform 28 illustrates the logic level of output $Q_1$ and input $D_2$. Waveforms 30 and 32 illustrate the logic levels of output terminals $Q_2$ and $\overline{Q}_2$, respectively, in flip flop Z2. Waveform 34 illustrates the modified clock output signal which occurs on output terminal 20. An examination of the waveforms of FIG. 2 reveals that when a pulse occurs at the output of voltage controlled oscillator 10, the output $Q_1$ of flip flop Z1 goes high until the next clock pulse in waveform 24 occurs. At that time, $Q_1$ goes low and $Q_2$ goes high and remains high until the next clock pulse occurs. While $Q_2$ is high, NOR gate Z3 prevents the passage of the crystal oscillator clock pulses. In FIG. 2, dotted clock pulse 36 has been inhibited. Therefore, the modified clock signal appearing on output terminal 20 has an average frequency which is equal to the crystal oscillator output frequency minus the voltage controlled oscillator output frequency.

Figure 3:
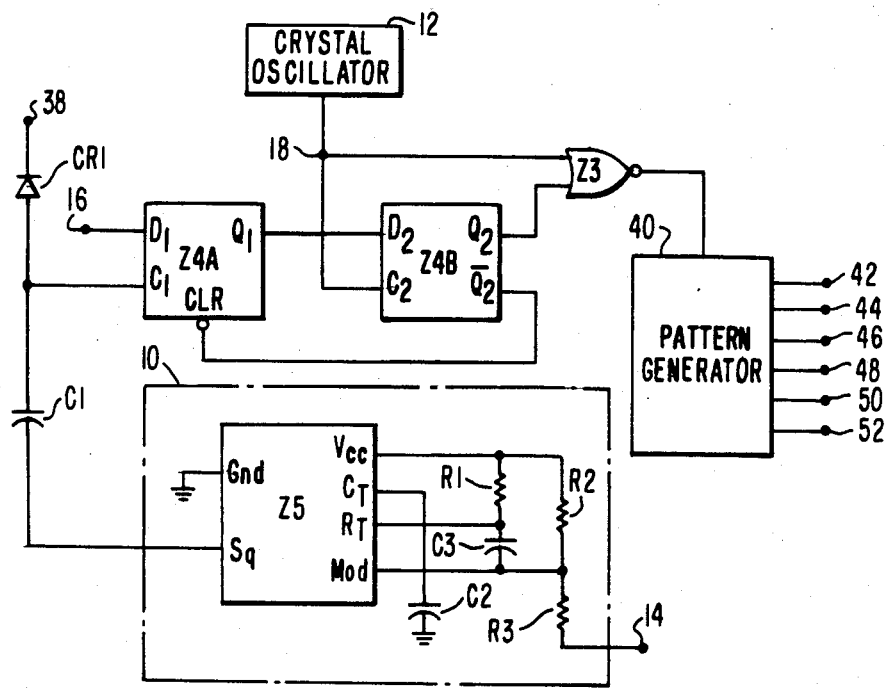
FIG. 3 is a schematic diagram of an alternative embodiment of the present invention.

FIG. 3 is a schematic diagram of an alternative embodiment of the present invention. In this embodiment, voltage controlled oscillator 10 can be seen to comprise a function generator Z5, resistors R1, R2 and R3, and capacitors C2 and C3. The output signal of VCO 10 passes through capacitor C1 to terminal $C_1$ of flip flop Z4A. In this embodiment, terminal 38 receives the supply voltage and flip flop circuits Z4A and Z4B are identical to Z1 and Z2 of FIG. 1. Pattern generator 40 receives the modified clock signal from NOR gate Z3 and produces a three-phase inverter power pole switching pattern on terminals 42, 44, 46, 48, 50 and 52. In this embodiment, pattern generator 40 comprises a digital circuit which does not include a microprocessor. If a microprocessor were included, output terminal $\overline{Q}_2$ would be connected to the ready input of the microprocessor as described above. Table I illustrates typical components which may be used in the circuit of FIG. 3.

TABLE I

| Components In The FIG. 3 Schematic Diagram | |
|---|---|
| CR1 | 1N914 |
| C1, C2, C3 | 0.001 μF |
| R1, R3 | 2K ohms |
| R2 | 1K ohm |
| Z3 | 5402 TTL NOR Gate |
| Z4 | 5474 TTL D Flip Flop |
| Z5 | 566 Function Generator |

Figure 5:
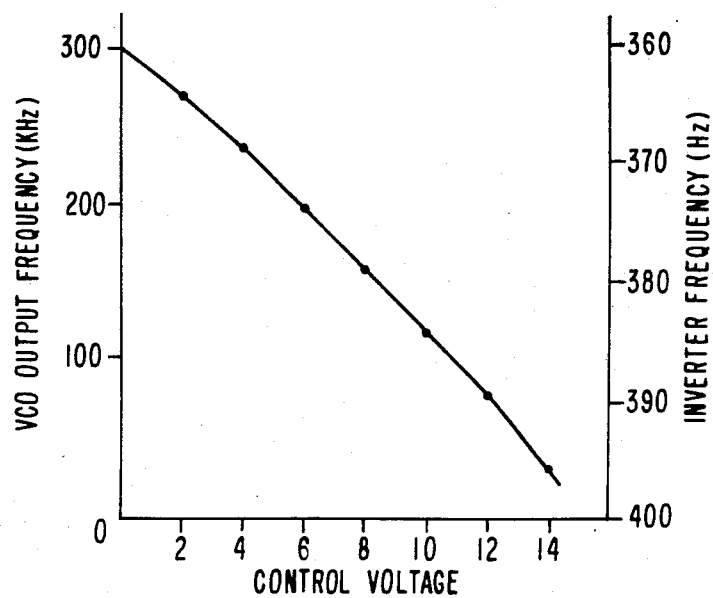
FIG. 5 is a curve showing the output characteristics of the circuit of FIG. 4.
Figure 4:
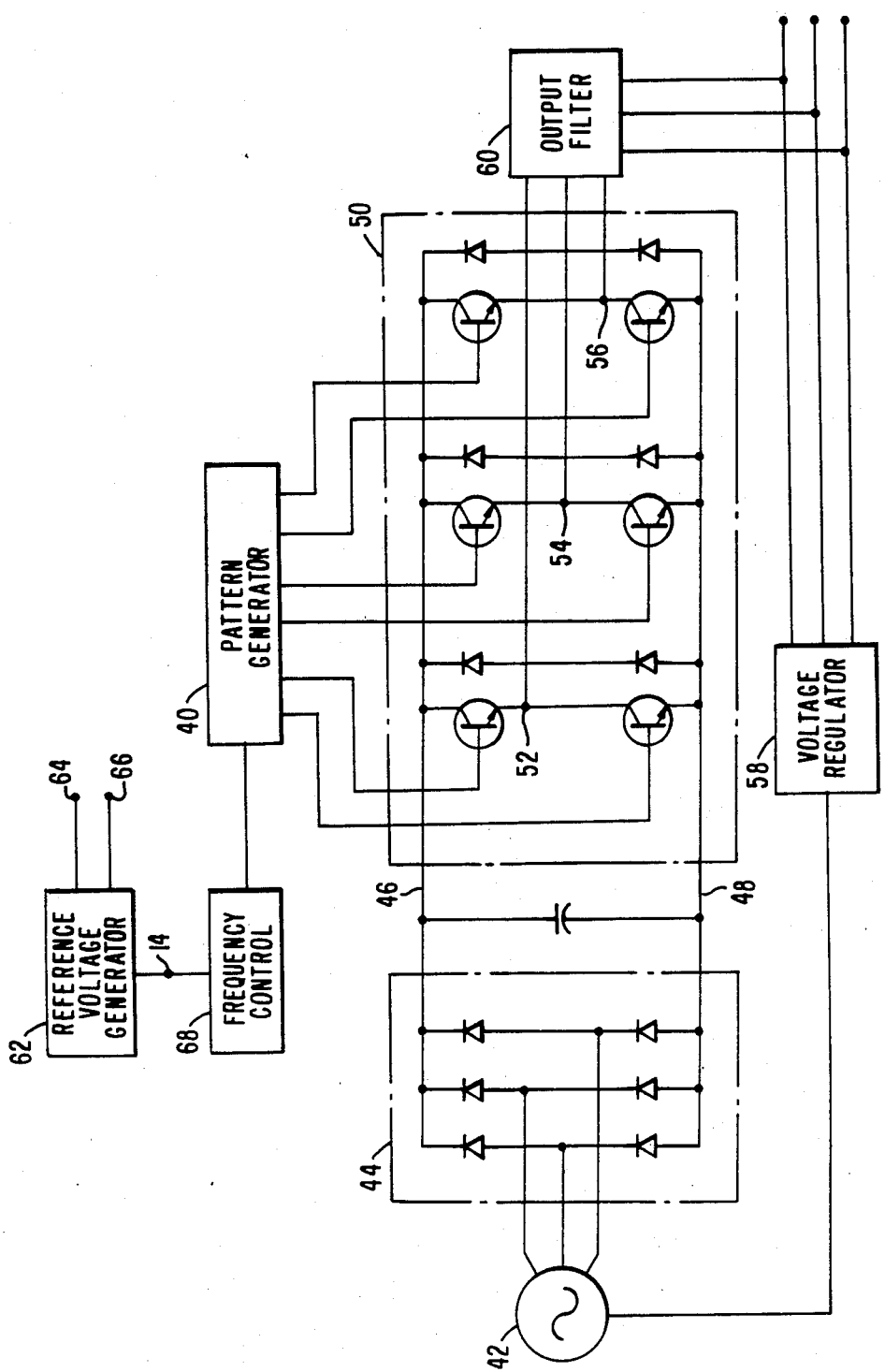
FIG. 4 is a schematic diagram of an inverter circuit which incorporates the present invention.

FIG. 4 is a block diagram, partially in schematic form, of a DC-link inverter system which includes a frequency control circuit constructed in accordance with the present invention. In this system, a variable speed generator 42 produces an alternating output which is rectified by bridge network 44 to produce a DC voltage on DC-link conductors 46 and 48. A plurality of transistor switches in a power pole switching network 50 are controlled by pattern generator 40 to alternatively switch power poles 52, 54 and 56 between the DC-link conductors. A voltage regulator 58 senses the voltage on the output lines following output filter 60 and controls the DC-link voltage by adjusting the exciter current in generator 42. When the inverter output lines are to be connected in parallel with an external power source, reference voltage generator 62 senses the frequency of the external source on terminal 64 and 66 and produces a control voltage on terminal 14 which represents the difference between the external power source frequency and the normal output frequency of the inverter. Frequency control 68, which may be constructed in accordance with FIG. 1 or FIG. 3, produces a modified clock signal or a wait signal as appropriate, depending on the pattern generator circuitry, thereby modifying the output frequency of the pattern generator to match the frequency of the external power source. FIG. 5 is the graph in which the voltage controlled oscillator output frequency and fundamental frequency of the inverter switching pattern are plotted versus the control voltage on terinal 14.

It should be apparent that when an inverter power system having a frequency control in accordance with this invention is connected in parallel with an external power source, the external power source becomes the master system. The frequency control provides the ability to adjust the output frequency of the inverter without the need for a variable main frequency clock circuit. The accuracy of the modified output frequency of the inverter then depends upon the accuracy of the control voltage difference signal and the output of the voltage controlled oscillator. Since the VCO operates at only a fraction of the main clock oscillator frequency, the stability of the modified clock signal will be nearly as good as that of the crystal oscillator. This invention therefore provides a means for controlling the frequency of any clock driven circuit over a relatively narrow range, while maintaining the basic accuracy of the original clock.

Although the present invention has been described in terms of what are at present believed to be its preferred embodiments, it will be apparent that various changes may be made without departing from the scope of the invention. It is, therefore, intended that the appended claims cover all such changes.

What is claimed is:
1. A frequency control circuit comprising:
an input terminal for receiving a clock signal comprising a plurality of voltage pulses which occur at a fixed frequency;
a voltage controlled oscillator for producing an output signal comprising a plurality of voltage pulses which occur at a variable frequency, dependent upon an applied control voltage;
first and second type D flip flop circuits;
said first flip flop circuit having a data input terminal, a clock input terminal, a clear input terminal, and a Q output terminal wherein said first flip flop circuit data input terminal is connected to a preselected logic signal and said first flip flop circuit clock input terminal is conected to receive said voltage controlled oscillator output signal;
said second flip flop circuit having a data input terminal, a clock input terminal, a clear input terminal, a Q output terminal and a $\overline{Q}$ output terminal wherein the data input terminal of said second flip flop circuit is connected to the Q output terminal of said first flip flop circuit, the clock input terminal of said second flip flop circuit is connected to receive said clock signal, and the $\overline{Q}$ output terminal of said second flip flop circuit is connected to the clear input terminal of said first flip flop circuit; and
a logic gate having two input terminals and an output terminal wherein the Q output terminal of said second flip flop circuit is connected to one of said logic gate input terminals and the other one of said logic gate input terminals is connected to receive said clock signal such that a modified clock signal occurs on said logic gate output terminal;

said modified clock signal being produced by passing the voltage pulses of said clock signal to said logic gate output terminal such that each clock signal voltage pulse which immediately succeeds a voltage controlled oscillator output signal voltage pulse is inhibited.

2. A frequency control circuit as recited in claim 1, further comprising:

a crystal oscillator for generating said clock signal.

3. An electric power system comprising:

a generator for producing a DC voltage on a pair of DC-link conductors;

an inverter for converting said DC voltage to a multiple phase AC output, said inverter including a pattern generator, a plurality of output power poles, and means for alternatively switching said power poles between one of said DC-link conductors having a positive polarity and the other one of said DC-link conductors having a negative polarity in accordance with a signal generator by said pattern generator; and a frequency control circuit for controlling the frequency of the output signal of said pattern generator, said frequency control circuit including an input terminal for receiving a clock signal comprising a plurality of voltage pulses which occur at a fixed frequency; a voltage controlled oscillator for producing an output signal comprising a plurality of voltage pulses which occur at a variable frequency, dependent upon an applied control voltage; first and second type D flip flop circuits; said first flip flop circuit having a data input terminal, a clock input terminal, a clear input terminal, and a Q output terminal wherein said first flip flop circuit data input terminal is connected to a preselected logic signal and said first flip flop circuit clock input terminal is connected to receive said voltage controlled oscillator output signal; said second flip flop circuit having a data input terminal, a clock input terminal, a clear input terminal, a Q output terminal and a $\overline{Q}$ output terminal wherein the data input terminal of said second flip flop circuit is connected to the Q output terminal of said first flip flop circuit, the clock input terminal of said second flip flop circuit is connected to receive said clock signal, and the $\overline{Q}$ output terminal of said second flip flop circuit is connected to the clear input terminal of said first flip flop circuit; and a logic gate having two input terminals and an output terminal wherein the Q output terminal of said second flip flop circuit is connected to one of said logic gate input terminals and the other one of said logic gate input terminals is connected to receive said clock signal such that a modified clock signal occurs on said logic gate output terminal; said modified clock signal being produced by passing the voltage pulses of said clock signal to said logic gate output terminal such that each clock signal voltage pulse which immediately succeeds a voltage controlled oscillator output signal voltage pulse is inhibited.

4. An electric power system circuit as recited in claim 3, further comprising:

a crystal oscillator for generating said clock signal.

* * * * *